(12) United States Patent
Pardoen et al.

(10) Patent No.: US 9,224,726 B2
(45) Date of Patent: Dec. 29, 2015

(54) ELECTROSTATIC DISCHARGE PROTECTION CIRCUIT, EQUIPMENT AND METHOD

(75) Inventors: Matthijs Pardoen, Pompetuzat (FR); Patrice Besse, Toulouse (FR)

(73) Assignee: FREESCALE SEMICONDUCTOR, INC., Austin, TX (US)

(*) Notice: Subject to any disclaimer, the term of this patent is extended or adjusted under 35 U.S.C. 154(b) by 1009 days.

(21) Appl. No.: 12/991,824

(22) PCT Filed: Jun. 4, 2008

(86) PCT No.: PCT/IB2008/053474
§ 371 (c)(1),
(2), (4) Date: Nov. 9, 2010

(87) PCT Pub. No.: WO2009/147471
PCT Pub. Date: Dec. 10, 2009

(65) Prior Publication Data
US 2011/0058293 A1    Mar. 10, 2011

(51) Int. Cl.
*H02H 9/04*    (2006.01)
*H01L 27/02*   (2006.01)

(52) U.S. Cl.
CPC ....... *H01L 27/0251* (2013.01); *Y10T 29/49155* (2015.01)

(58) Field of Classification Search
USPC .......................................................... 361/56
See application file for complete search history.

(56) References Cited

U.S. PATENT DOCUMENTS

| | | | |
|---|---|---|---|
| 6,268,990 B1* | 7/2001 | Ogura et al. | 361/91.7 |
| 6,483,683 B1* | 11/2002 | Stenstrom | 361/91.1 |
| 6,529,359 B1 | 3/2003 | Verhaege et al. | |
| 6,549,061 B2* | 4/2003 | Voldman | H01L 27/0259 327/324 |
| 6,898,061 B1* | 5/2005 | Kimber | H03K 17/0826 361/56 |
| 2004/0105201 A1 | 6/2004 | Wu et al. | |
| 2005/0286188 A1* | 12/2005 | Camp | H03K 17/08142 361/56 |
| 2006/0043490 A1 | 3/2006 | Brauchler et al. | |
| 2007/0047162 A1 | 3/2007 | Watanabe et al. | |
| 2007/0188952 A1* | 8/2007 | Ker et al. | 361/56 |
| 2008/0055805 A1 | 3/2008 | Pong et al. | |
| 2008/0239599 A1* | 10/2008 | Yizraeli et al. | 361/56 |
| 2009/0180224 A1* | 7/2009 | Ker et al. | 361/56 |

OTHER PUBLICATIONS

International Search Report and Written Opinion correlating to PCT/IB2008/053474 dated Jan. 29, 2009.

(Continued)

*Primary Examiner* — Thienvu Tran
*Assistant Examiner* — Angela Brooks

(57) ABSTRACT

An electrostatic discharge (ESD) protection circuit for protecting one or more devices in an electronic circuit from an ESD current which enters the electronic circuit through one or more input/output pins, the protection circuit comprising: a voltage clamp circuit connectable to the or each pin, for diverting the ESD current from the or each device; and a current sensor circuit connected between the input/output pins and the voltage clamp circuit and connected to the one or more devices, the current sensor circuit for sensing the ESD current and for switching off the or each device when the sensed current exceeds a threshold value, wherein when a current flows in the current mirror circuits above a threshold value the device is caused to switch off.

20 Claims, 5 Drawing Sheets

(56) References Cited

OTHER PUBLICATIONS

Ker, Ming-Dao, "Whole-chip ESD protection design with efficient VDD-to-VSS ESD clamp circuits for submicron CMOS VLSI," IEEE Transactions on Electron Devices, vol. 46, No. 1, Jan. 1999, pp. 173-183.

Amerasekera, A. et al., "ESD in Silicon Integrated Circuits," 2nd Edition, John Wiley & Sons, Ltd., May 2002, 421 pages.

International Electrotechnical Commission, "Electromagnetic compatibility (EMC)—Part 4-2: Testing and measurement techniques—Electrostatic discharge immunity test," Edition: 1.2, CEI IEC 61000-4-2; Apr. 26, 2001, 42 pages.

Electronic Industries Association, "EIA/JEDEC Standard: Test Method A115-A, Electrostatic Discharge (ESD) Sensitivity Testing Machine Model (MM)", EIA/JESD22-A115-A; Oct. 1997, 11 pages.

\* cited by examiner

ELECTROSTATIC DISCHARGE PROTECTION CIRCUIT, EQUIPMENT AND METHOD

FIELD OF THE INVENTION

This invention relates to an electrostatic discharge protection circuit, to an equipment including such a circuit and to a method of manufacturing such a circuit.

BACKGROUND OF THE INVENTION

An electrostatic discharge (ESD) is a sudden unwanted current that can flow between two objects at different electrical potentials and as a result cause damage to electronic equipment that constitutes one or other of the two objects. ESD is a serious issue in solid-state electronics and can cause immediate permanent damage to a circuit or can result in less obvious forms of degradation that may affect the long-term reliability and performance of the circuit. As a result, there are many methods, systems and circuits for preventing an ESD event. The ESD prevention can form part of the circuit or device or can constitute an external protection component located within the circuit layout.

In order to determine the susceptibility of an electronic circuit to an ESD event, there are a number of ESD test models which exist and which specify the nature of an ESD event. The models are defined by various standards and the most common models include the human body model (HBM), the gun stress model (GSM) and the machine model (MM).

The gun or machine model ESD event as specified in International Electronics Commission (IEC), standard 61000-4-2 and Joint Election Device Engineering Course JESD22-A115A respectively, deal with situations where the ESD injected current may be high. The table below shows the situation for contact discharge and air discharge and sets out a level to which the equipment specification should comply and required test voltage associated with each level. The standard ESD gun test current waveform is shown in FIG. 1.

| 1a - Contact discharge | | 1b - Air discharge | |
| --- | --- | --- | --- |
| Level | Test voltage kV | Level | Test voltage kV |
| 1 | 2 | 1 | 2 |
| 2 | 4 | 2 | 4 |
| 3 | 6 | 3 | 8 |
| 4 | 8 | 4 | 2 |
| x[1)] | Special | x[1)] | Special |

[1)]"x" is an open level. The level has to be specified in the dedicated equipment specification. From IEC 61000-4-2 if higher voltages than those shown are specified, special test equipment may be needed.

Standard prior art protection circuits protect integrated circuits (IC) by means of voltage clamps combined with diodes or PNP transistors connected to the input and output (I/O) pins. These protection circuits divert the current that is being injected during an ESD event by essentially clamping the IC pin voltage at a level that is sufficient to avoid circuit destruction. However, when large sized power transistors, with low ohmic routing, connect to an input/output (I/O) pin, an ESD event can cause a fast voltage transient (high dV/dt event) which results in either the base or gate of the power transistor being pulled up through a parasitic base collector or drain gate capacitance, allowing the power transistor to switch on. Even though the pin voltage is clamped and stays below the transistor breakdown voltage, the power transistor current resulting from this could easily result in device destruction if the ESD injected current is sufficiently high, such as might be experienced during an ESD gun or machine model event.

FIG. 2 shows an example of a prior art drawing showing a bipolar transistor ESD protection circuit which includes three input/output (I/O) pins 200, 202, 204; three diodes 206, 208, 210 and a voltage clamp 212.

US2006/0043490A1 discloses a system and method for the protection of a transistor from electrostatic discharge current associated with an ESD event. This is achieved by implementing an ESD detector circuit which is separate from the main clamp circuit and which detects an ESD event by detecting a high dV/dt event using an RC time constant and capacitive coupling. However, it is necessary to optimise the RC time constant for a particular ESD model event and in the case where inductive loads are switched, the ESD detect circuit can be triggered during normal operation.

SUMMARY OF THE INVENTION

The present invention provides an electrostatic discharge protection circuit, equipment including such a circuit and method of manufacturing such a circuit as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. Elements in the figures are illustrated for simplicity and clarity and have not necessarily been drawn to scale.

DETAILED DESCRIPTION OF THE PREFERRED EMBODIMENTS

Figure 3:
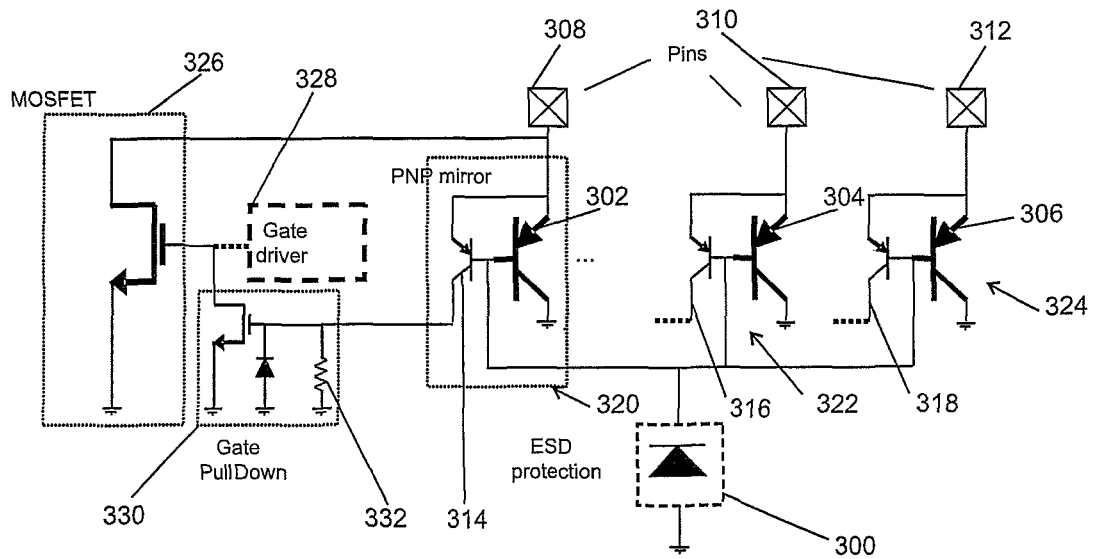
FIG. 3 schematically shows an example of an embodiment of an ESD protection circuit.

Referring to FIG. 3 an example of protecting integrated circuitry, for example protecting a high-voltage output transistor switch from drawing current during a high current ESD event, is shown. The device protected could be an amplifier, such as a bipolar or MOS. Similarly, the device could include a cascade of transistors. However the ESD protection circuitry may be used for other types of devices and for other types of ESD events. The circuit described and illustrated in FIG. 3 includes a centralised clamp 300 which is connected to the cathode (or base) of one or more large isolation diodes or a transistor such as a parasitic transistor 302, 304 and 306 with their anodes (or emitters) connected to the circuit I/O pins 308, 310 and 312 respectively. The circuit further comprises one or more lateral bipolar transistors 314, 316 and 318 which form current mirrors 320, 322 and 324 with the respective large isolation diodes which form current sensor circuits. From a fabrication point of view each of the lateral bipolar transistors may be formed in a single well by drawing stripes in the proximity of the isolation diodes stripes. These stripes may form the collector of the so formed lateral bipolar transistors and are used as ESD current sense elements that are connected to the output transistor's (326) gate or base pull down circuitry (330). The gate or base pull down circuit effectively constitutes a control circuit for the device or devices. This will be described in greater details with respect to FIGS. 4 and 5. The value of the mirror ratio can be determined by the length of the stripes mentioned earlier, as will be described in greater detail with respect to FIG. 5.

Figure 1:
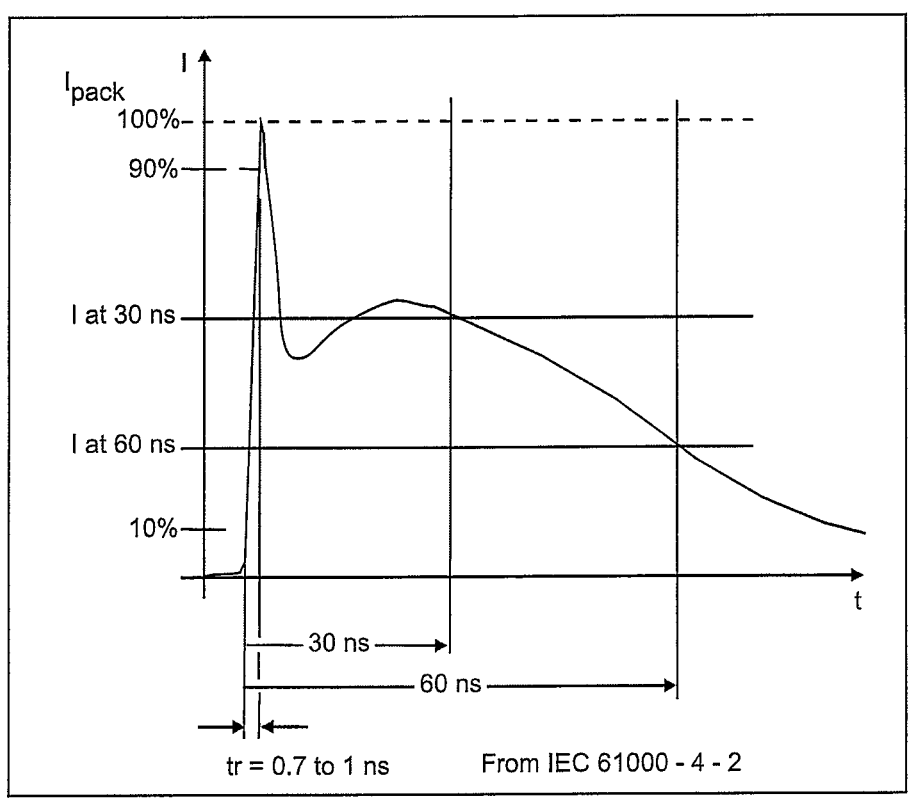
FIG. 1 schematically shows an example of an ESD current waveform associated with the table, in accordance with the prior art.
Figure 2:
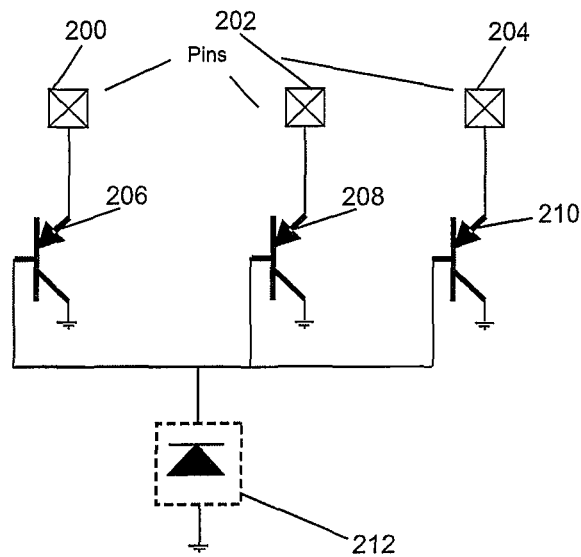
FIG. 2 is a circuit diagram of a prior art ESD circuit.

During a positive ESD event on one or more pins, the isolation diodes 302, 304 and 306 and the centralised clamp 300 will divert the main ESD current. The current mirrors 320, 322 and 324 sense the ESD current and switch on the pull down circuitry, thereby avoiding capacitive pull-up of the output transistor's (326) gate or base and switching off the output transistor 326. This effectively prevents the output transistor from switching on and self-destructing. The integrated circuit may also includes a gate driver 328 being part of the circuit that is active under normal operating conditions connected to the output transistor 326. The output transistor 326 may be in the form of a MOSFET or any other appropriate type of device. The output transistor 326 may, as shown be connected to the pin to drive the voltage and/or current as the pin and thus to output signals. The protection circuitry and the device(s) to be protected may be included in a single integrated circuit, for example on multiple dies provided in a single package or on a single die. Although not shown in FIG. 1, the output transistor 326 may be connected, via gate driver 328 to a source of the signals to be outputted, such as a processor core or other suitable circuitry.

The pull-down circuitry (330) will become active above a certain threshold value, for example an ESD current threshold value. As shown, the bipolar transistors 314, 316, 318, are connected with a current output to the control input, e.g. in this example, the gate of the pull down transistor. A resistor 332 connects the current output to ground and forms a current to voltage converter. A diode is connected with a cathode to the gate and with an anode to ground. Thus, when the voltage diode is in reverse, the current will flow through the resistor 332, and the voltage generated by the resistor 332 will cause the pull down resistor to pull down the gate of the output transistor 326. The circuit properties may be designed or redesigned by varying the value of the resistor 332 and the mirror ratio of all or any of the PNP mirrors. For example, the circuit may be designed to pull down the output power transistors gate when the ESD injected current equals 10 Amps and to do nothing if the value of current is below this. Alternatively, the threshold may be 2 Amps for certain output transistor 326 or any other value depending on the circuit requirement. The gate pull down circuit could alternatively be in the form of a current mirror, a bipolar transistor, a cascade of amplifiers or any other device having a current input and current output. The gate pull down circuit may include a current to voltage (not shown per se) converter circuit for example a resistor. In an alternative, the current to voltage converter circuit may be separate from the gate pull down circuit.

Figure 4:
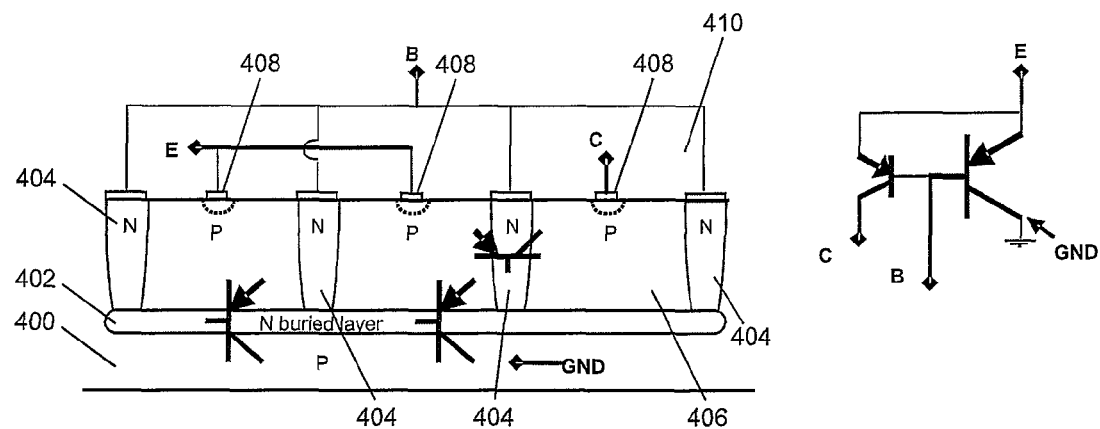
FIG. 4 schematically shows an example of an embodiment of a cross-section of the PNP mirror of FIG. 3.

The PNP mirrors 320, 322 and 324 may be made by means of different components. FIG. 4 shows an embodiment thereof. A cross-section of a PNP mirror is shown identifying the layout of the different materials in terms of N-type and P-type materials. The cross-section shows a first p-type substrate 400 on to which an N-type layer 402 is added. N-type sinkers 404 are masked on to the n-type layer and a layer of insulator 406 is applied. Highly doped P-type regions 408 are then applied. The figure also identifies the emitter (e), the base (b) and the collectors (c) of the so formed vertical and lateral bipolar transistors.

Figure 5:
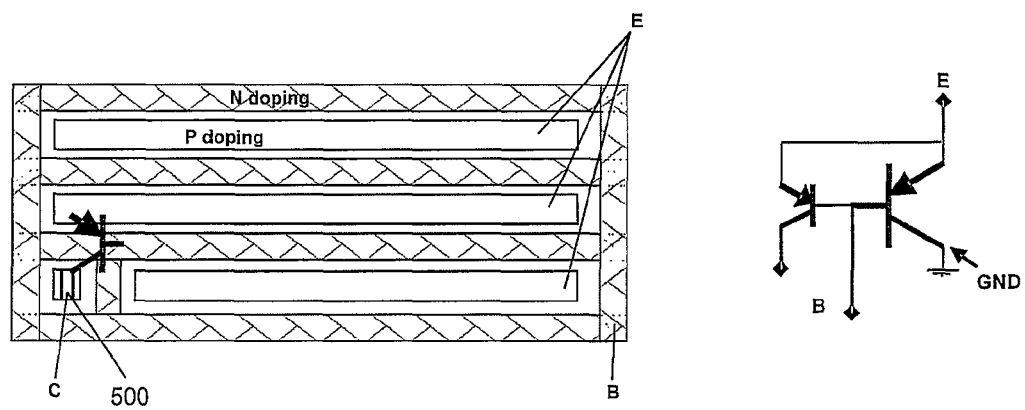
FIG. 5 schematically shows an example of an embodiment of the top side view of the PNP mirror FIGS. 3 and 4.

Referring to FIG. 5 a top view of the layout of the PNP mirror is illustrated. The collector (C) and emitters (stripes E) are made of p-type material as previously indicated. The base (B) is made of n-type material and surrounds the stripes (E). The island 500 is added to form the collector of lateral bipolar device. This results in the PNP mirror being relatively easily produced with a little change to the layout and without the need for process changes. The ratio of the lengths of the island to the stripes is used to define and determine the mirror ratio of the PNP mirrors. The island defining the proportion of current in the lateral bipolar transistor and the stripe defining the proportion of current in the large isolation diode. The mirror ratio may be associated with the threshold value, such that threshold value changes can be managed by designing the current mirror with a different ratio or changing the value of resistor 332 in FIG. 3. In order to change the mirror ratio the length of the island can be made larger or smaller.

Figure 6:
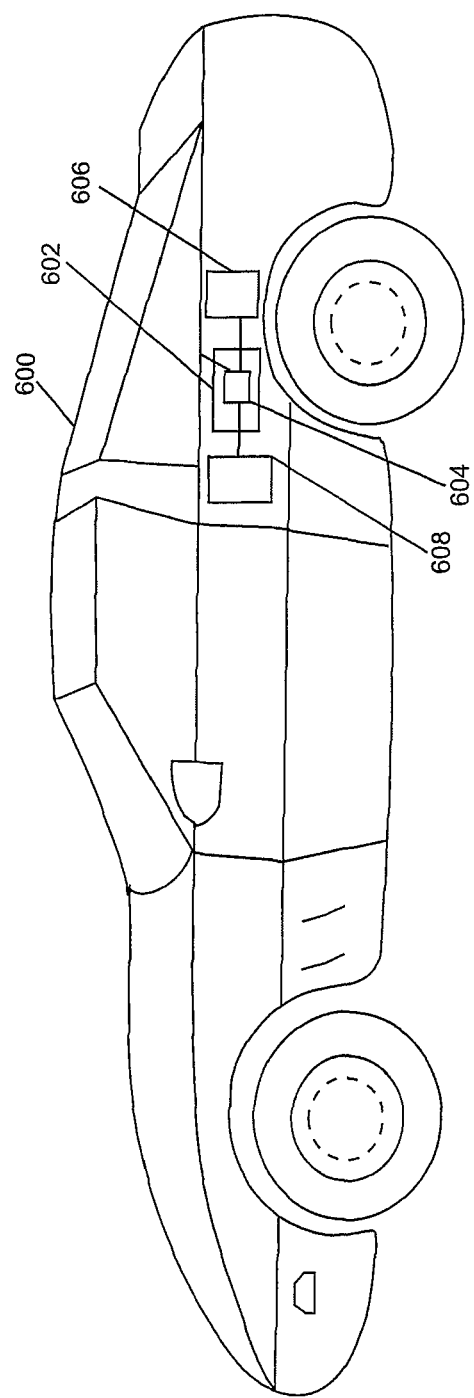
FIG. 6 schematically shows an example of an embodiment of an automobile including an ESD protection circuit.
Figure 7:
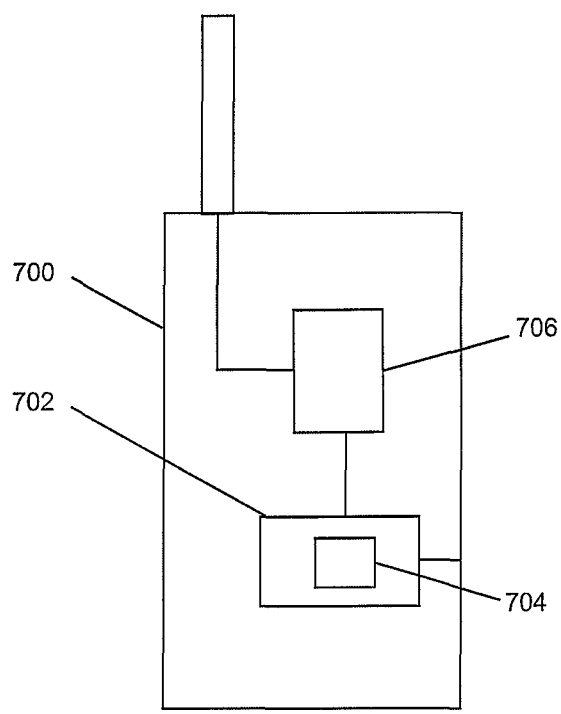
FIG. 7 schematically shows an example of an embodiment of a mobile phone including an ESD protection circuit.

The ESD circuit can form part of an ESD system for example as shown in FIG. 6 in an automobile. The automobile 600 includes an ESD system 602 including the ESD circuit 604 which are used to protect the engine 606 and electronics or other circuitry 608 in the car. Similarly in FIG. 7 a mobile phone 700 includes an ESD system 702 including the ESD circuit according to the present invention 704 which is designed to protect the electronics and circuitry 706 in the mobile phone.

In the foregoing specification, the invention has been described with reference to specific examples of embodiments of the invention. It will, however, be evident that various modifications and changes may be made therein without departing from the broader spirit and scope of the invention as set forth in the appended claims. For example, the connections in the circuit, system or device may be a type of connection suitable to transfer signals from or to the respective nodes, units or devices, for example via intermediate devices. Accordingly, unless implied or stated otherwise the connections may for example be direct connections or indirect connections.

Also, the centralised clamp 300 may be located in different orientations than in a central orientation, for example the clamp 300 may be located closer to certain I/O pins than others. The clamp, whether centralised or not, may be in the form of a Zener diode, which may be connected to the base of all the bipolar transistors. The clamp may also be in the form of a diode string, a silicon controlled rectifier, a grounded gate NMOS (ggNMOS) or switches that fire when a fast voltage transient is detected. The semiconductor substrate described herein can be any semiconductor material or combinations of materials, such as gallium arsenide, silicon germanium, silicon-on-insulator (SOI), silicon, monocrystalline silicon, the like, and combinations of the above.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention has been described with respect to specific conductivity types or polarity of potentials, skilled artisans appreciated that conductivity types and polarities of potentials may be reversed.

Moreover, the terms "up", "down", "front," "back," "top," "bottom," "over," "under" and the like in the description and in the claims, if any, are used for descriptive purposes and not necessarily for describing permanent relative positions. It is understood that the terms so used are interchangeable under appropriate circumstances such that the embodiments of the invention described herein are, for example, capable of operation in other orientations than those illustrated or otherwise described herein.

Some of the above embodiments, as applicable, may be implemented using a variety of different information processing systems. For example, although FIG. 3 and the discussion thereof describes an exemplary ESD protection circuit architecture, this exemplary architecture is presented merely to provide a useful reference in discussing various aspects of the invention. Of course, the description of the architecture has been simplified for purposes of discussion, and it is just one of many different types of appropriate architectures that may be used in accordance with the invention.

Thus, it is to be understood that the architectures depicted herein are merely exemplary, and that in fact many other architectures can be implemented which achieve the same functionality. In an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "operably connected," or "operably coupled," to each other to achieve the desired functionality.

Furthermore, those skilled in the art will recognize that boundaries between the functionality of the above described operations merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An electrostatic discharge (ESD) protection circuit for protecting one or more devices in an electronic circuit from an ESD current which enters the electronic circuit through one or more input/output pins, the protection circuit comprising:
   a voltage clamp circuit connectable to a pin, for diverting the ESD current from a device;
   a current sensor circuit connected to the pin and the voltage clamp circuit and connected to the device, the current sensor circuit for sensing the ESD current and for switching off the device when the sensed current exceeds a threshold value.

2. The protection circuit of claim 1, wherein said voltage clamp circuit includes at least one diode connecting said pin to a current sink, and wherein said current sensor circuit includes a current mirror for providing a mirror current or said ESD current.

3. The protection circuit of claim 1, further comprising a device control circuit for switching off the device when the sensed current exceeds a threshold value.

4. The protection circuit of claim 1, wherein the device control circuit further comprises a gate pull down circuit connected between the device and the current sensor circuits.

5. The protection of claim 4, wherein the gate pull down circuit can also protect the device from a voltage surge when there is no ESD current.

6. The protection circuit of claim 4, wherein the current sensor circuit has a ratio which determines the relative proportions of current in the voltage clamp circuit and the gate pull down circuit.

7. The protection circuit of claim 6, wherein the ratio is associated with the threshold value.

8. The protection circuit of claim 1, wherein the threshold value is dependent upon the type of device.

9. The protection circuit of claim 1, wherein the current sensor circuit is the PNP current mirror.

10. The protection circuits of claim 1, wherein the current sensor circuit comprises a bipolar transistor and a diode.

11. The protection circuit as claimed in claim 2, wherein said diode includes first regions, a first layer of a first type of doping in between adjacent second layers of a second type of doping, opposite to said first type and wherein said current mirror includes a second region in said first layer provided with said second type of doping in between first regions of said first layer.

12. The protection circuit of claim 1, wherein the device comprises an amplifier.

13. An integrated circuit including the device, the pin and the protection circuit as claimed in claim 1.

14. Equipment including a protection circuit according to claim 1.

15. A method of manufacturing a protection circuit for protecting one or more devices from an ESD current which enters the circuit through one or more input/output pins, the method comprising the steps of:
   forming a voltage clamp circuit on a substrate connectable to a pin for diverting current from said device;
   forming a current sensor circuit on the substrate such that the current sensor circuit is connected between the pin and the voltage clamp circuit and is connected to said device, the current sensor circuit for sensing the ESD current and for switching off the device when the sensed current exceeds a threshold value.

16. The protection circuit of claim 2, further comprising a device control circuit for switching off the device when the sensed current exceeds a threshold value.

17. The protection circuit of claim 2, wherein the device control circuit further comprises a gate pull down circuit connected between the device and the current sensor circuits.

18. The protection circuit of claim 5, wherein the current sensor circuit has a ratio which determines the relative proportions of current in the voltage clamp circuit and the gate pull down circuit.

19. The protection circuit as claimed in claim 3, wherein said diode includes first regions, a first layer of a first type of doping in between adjacent second layers of a second type of doping, opposite to said first type and wherein said current mirror includes a second region in said first layer provided with said second type of doping in between first regions of said first layer.

20. The protection circuit of claim 2, wherein the device comprises an amplifier.

\* \* \* \* \*